(12) United States Patent
Li et al.

(10) Patent No.: US 8,070,496 B2
(45) Date of Patent: Dec. 6, 2011

(54) CONTACT TERMINAL UNIT AND SOCKET CONNECTOR INCORPORATED WITH THE SAME CONTACT TERMINAL UNITS

(75) Inventors: Ren-Chih Li, Tu-Cheng (TW); Yu-Hung Yen, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/875,143

(22) Filed: Sep. 3, 2010

(65) Prior Publication Data

US 2011/0053422 A1 Mar. 3, 2011

(30) Foreign Application Priority Data

Sep. 3, 2009 (TW) .............................. 98129621 A

(51) Int. Cl.
*H01R 12/00* (2006.01)
*H05K 1/00* (2006.01)
(52) U.S. Cl. ........................................................ 439/66

(58) Field of Classification Search .................... 439/66, 439/65, 626, 91
See application file for complete search history.

(56) References Cited

U.S. PATENT DOCUMENTS 6,079,987 A * 6/2000 Matsunaga et al. ............. 439/66
7,413,466 B2 * 8/2008 Clark et al. .................... 439/461

* cited by examiner

*Primary Examiner* — Javaid Nasri
(74) *Attorney, Agent, or Firm* — Andrew C. Cheng; Wei Te Chung; Ming Chieh Chang

(57) ABSTRACT

The present invention relates to a contact terminal unit and a socket connector incorporated with the same contact terminal units. A contact terminal unit comprises a plurality of conductive strings twisted into a single strand, and an insulative material encapsulating the strand. The socket connector is incorporated with a plurality of the same contact terminal units.

8 Claims, 3 Drawing Sheets

CONTACT TERMINAL UNIT AND SOCKET CONNECTOR INCORPORATED WITH THE SAME CONTACT TERMINAL UNITS

BACKGROUND OF THE INVENTION

1. Field of the Invention

The present invention relates to a contact terminal unit, and more particularly to a contact terminal configured by a plurality of twisted conductive strings encapsulated within an insulative column. The present invention also includes a socket connector incorporated with the contact terminals described above.

2. Description of Prior Art

Electrical connector is widely used for electrically and mechanically connecting an electronic package such as a CPU to a PCB (Printed Circuit Board) such as a motherboard. Generally, the electrical connector comprises an insulative housing having a plurality of passageways, and a plurality of contact terminals received in the plurality of passageways, correspondingly.

Usually, the contact terminals are made of metal material via art of stamping. The contact terminal usually has a base portion with a plurality of barbs thereon. The barbs are used to penetrate into and interferentially engage with inner walls of the passageway, so as to secure the contact terminal in the corresponding passageway.

However, such conventional contact terminal brings some negative effects. Firstly, the contact terminal usually further has a mating portion and a solder portion extending from the base portion for engaging with an IC (Integrated Circuit) package and a substrate, respectively. Thus, the conventional contact terminal has a complicated structure and geometrical profile. Obviously, manufacturing cost of such conventional contact terminal is high. Secondly, when a conventional contact terminal is inserted into the passageway, the barbs will penetrate into inner walls of the passageway. Accordingly, the housing may be warpaged and performance of the housing will be affected.

In view of the above, an improved contact terminal unit and a socket connector that overcomes the above-mentioned disadvantages are desired.

SUMMARY OF THE INVENTION

Accordingly, an object of the present invention is to provide a contact terminal unit and a socket connector incorporated with the same contact terminal unit, and more particularly to a contact terminal configured by a plurality of twisted conductive strings encapsulated within an insulative column and a socket connector incorporated with the same contact terminal units thereby prevent the housing of the socket connector from damage when the contact terminal unit is inserted into the passageway of the housing.

To achieve the above-mentioned object, a contact terminal unit and a socket connector incorporated with the same contact terminal units are provided. A contact terminal unit comprises a plurality of conductive strings twisted into a single strand, and an insulative material encapsulating the strand. The socket connector is incorporated with a plurality of the same contact terminal units. The contact terminal unit is capable of elastically abutting against inner wall of the passageway when it is inserted into the passageway. Accordingly, the inner wall of the passageway could avoid being damaged by the contact terminal unit.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
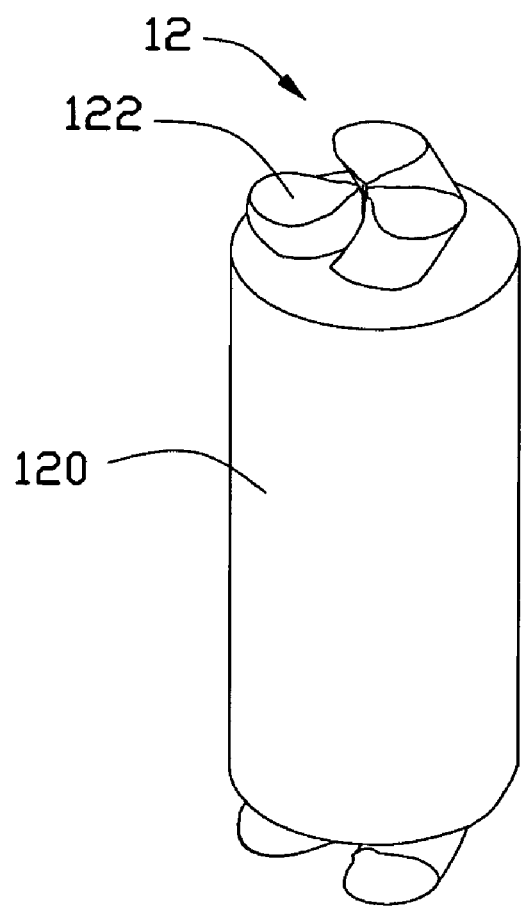
FIG. 1 is an isometric view of a contact terminal of an electrical connector in accordance with a preferred embodiment of the present invention.
Figure 2:
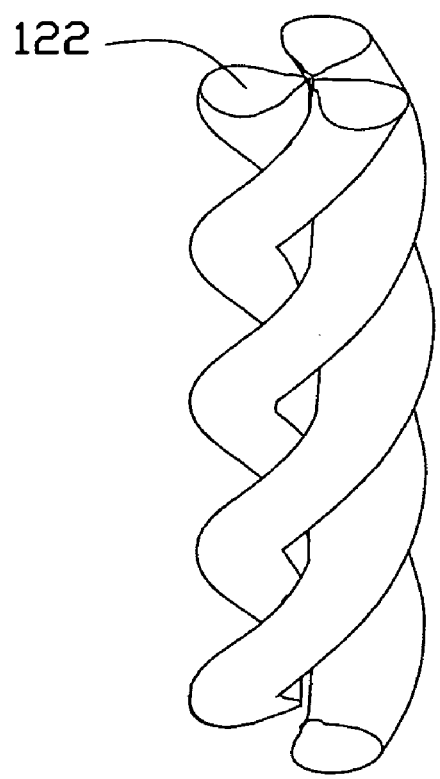
FIG. 2 is an isometric view of a single strand in accordance with the preferred embodiment of the present invention.
Figure 3:
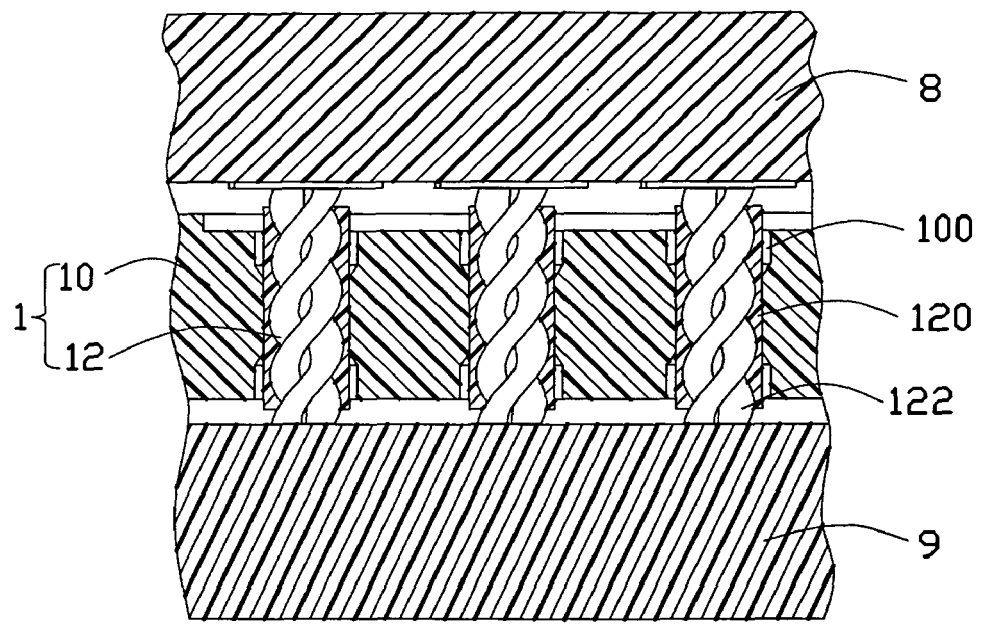
FIG. 3 is a cross-section view of the electrical connector in accordance with the preferred embodiment of the present invention.

Referring to FIGS. 1-3, the contact terminal unit 12 is used for electrically connecting an electrical package 8 with a PCB 9. The contact terminal unit 12 comprises a plurality of conductive strings twisted into a single strand 122 and an elastic insulative material 120 encapsulating the strand 122. Number of the conductive strings is three. The single strand 122 may be integrally formed with insulative material 120 via art of inset-molding. In this embodiment, the single strand 122 is formed with three conductive wires interlacing with one another, so as to form a solid structure. The insulative material 120 is of a cylindrical shape and may be made from silica gel. In this embodiment, the single strand 122 is surrounded by the insulative material 120, with two opposite ends of the single strand 122 extending beyond the insulative material 120 for interconnecting the two electric components 8, 9, respectively.

The contact terminal unit 12 can be used in an electrical connector 1 in accordance with a preferred embodiment of the present invention for electrically connecting an IC package 8 with a PCB 9. The electrical connector 1 comprises an insulative housing 10 and a plurality of contact terminal units 12 received in the insulative housing 10.

The insulative housing 10 has an upper face and a lower face, and a plurality of passageways 100 extending therebetween. When the contact terminal unit 12 is inserted into the passageway 100, the insulative material 120 will be deformed and abut against inner walls of the passageway 100. Thus, the contact terminal 10 will be retained in the passageway 100 by an elastic force from the insulative material due to deformation. The opposite free ends of the single strand 122 extend beyond the upper face and the lower face of the insulative housing 10 for interconnecting the IC package 8 with the PCB 9, respectively. Accordingly, the inner wall of the passageway 100 could avoid being damaged by the contact terminal.

While the preferred embodiment in accordance with the present invention has been shown and described, equivalent modifications and changes known to persons skilled in the art according to the spirit of the present invention are considered within the scope of the present invention as defined in the appended claims.

What is claimed is:

1. A socket connector for interconnecting two electronic components, comprising:

an insulative housing having a plurality of passageways extending between an upper face and a lower face thereof; and a plurality of contact terminal units received in the passageways, respectively, each contact terminal comprising:
a plurality of conductive strings twisted into a single strand; and
an insulative material encapsulating the strand; and
wherein the plurality conductive strings are fixed by the insulative material with opposite ends thereof respectively extending beyond a top and bottom faces of the insulative material and beyond the upper and lower faces of the insulative housing; and wherein
the contact terminal unit is retained in the passageway by the insulative material elastically abutting against inner wall of the insulative housing.

2. The socket connector as claimed in claim 1, wherein number of the conductive strings is three.

3. The socket connector as claimed in claim 2, wherein the insulative material is formed with a cylindrical shape.

4. The socket connector as claimed in claim 1, wherein the insulative material is integrally formed with the single strand, two opposite ends of the single strand extending beyond the insulative material for interconnecting the two electronic components, respectively.

5. The socket connector as claimed in claim 4, wherein the insulative material extends beyond both the upper face, lower face.

6. An electrical socket assembly comprising:
an insulative housing defining opposite upper and lower surfaces in a vertical direction with a plurality passageway defined therebetween;
a plurality of terminal units snugly embedded in the corresponding passageway of the housing;
each of said terminal units including an inner conductive wire set axially surrounded by insulative material essentially along said vertical direction; wherein
each of said terminal units defines two opposite ends respectively extending beyond the upper and lower surfaces in said vertical direction, and is compressible in said vertical direction when an upper electronic component and a lower electronic component is located intimately around the upper surface and the lower surface and electrically and mechanically connected with each of said terminal units; and
wherein the inner conductive wire set is fixed by the insulative material with opposite ends thereof respectively extending beyond a top and bottom faces of the insulative material; and
wherein the terminal unit is positioned in the passageway by an elastic force from the insulative material due to deformation.

7. The electrical socket assembly as claimed in claim 6, wherein said inner wire set is essentially composed of a plurality of strings twisted together as a strand.

8. The electrical socket assembly as claimed in claim 7, wherein each of said passageways leaves a space from the corresponding terminal unit around each of the upper surface and the lower surface when said terminal unit is in a relaxed manner so as to allow said terminal unit to be radially expanded when compressed in said vertical direction.

* * * * *